United States Patent [19]
Thakur et al.

[11] Patent Number: 5,360,769
[45] Date of Patent: * Nov. 1, 1994

[54] METHOD FOR FABRICATING HYBRID OXIDES FOR THINNER GATE DEVICES

[75] Inventors: Randhir P. S. Thakur; Annette L. Martin; Ralph E. Kauffman, all of Boise, Id.

[73] Assignee: Micron Semiconductor, Inc., Boise, Id.

[ * ] Notice: The portion of the term of this patent subsequent to Nov. 23, 2010 has been disclaimed.

[21] Appl. No.: 991,817

[22] Filed: Dec. 17, 1992

[51] Int. Cl.$^5$ ............................................. H01L 21/02
[52] U.S. Cl. ..................... 437/239; 437/42; 437/238
[58] Field of Search ................... 437/238, 239, 42

[56]     References Cited
      U.S. PATENT DOCUMENTS

| | | | |
|---|---|---|---|
| 4,851,370 | 7/1989 | Doklan et al. | 437/247 |
| 5,000,113 | 3/1991 | Wang et al. | 118/723 |
| 5,089,442 | 2/1992 | Olmer | 437/238 |
| 5,229,334 | 7/1993 | Kato | 437/239 |
| 5,264,396 | 11/1993 | Thakur et al. | 437/238 |

*Primary Examiner*—Olik Chaudhuri
*Assistant Examiner*—C. Everhart
*Attorney, Agent, or Firm*—Lia M. Pappas

[57]     ABSTRACT

A method and system for fabricating semiconductor wafers is disclosed wherein an atomically clean, semiconductor substrate having a surface is provided in a rapid thermal processing chamber. One embodiment involves cleaning the substrate by exposing it to a first gas at a temperature substantially within the range of 850° C. to 1250° C. for approximately 10 to 60 seconds. Subsequently, a coating having a first thickness is formed superjacent the substrate surface by introducing a second gas at a temperature substantially within the range of 850° C. to 1250° C. for approximately 5 to 30 seconds in the chamber. The resultant coating, depending on the gas selected, comprises either $SiO_2$ or Si-F.

Subsequently, the substrate having the coating is exposed to a third gas at a temperature substantially within the range of 900° C. to 1050° C. for approximately 30 minutes to one hour, thereby forming a silicon dioxide layer. The silicon dioxide layer is disposed superjacent the substrate and subjacent the coating. In one embodiment of the invention, this step is performed in a furnace. In an alternate embodiment of the present invention, a transferring device, such as a robot, is employed, using a load lock, to transfer the substrate between the RTP chamber and the furnace without exposing the substrate to atmospheric pressure.

20 Claims, 6 Drawing Sheets

METHOD FOR FABRICATING HYBRID OXIDES FOR THINNER GATE DEVICES

FIELD OF THE INVENTION

This invention relates to VLSI semiconductor processes and to a method for fabricating MOS/CMOS transistors. More particularly, the invention relates to a process for manufacturing a high integrity oxide layer useful for thin gate devices.

BACKGROUND OF THE INVENTION

The continuing trend of scaling down integrated circuits has forced the semiconductor industry to consider new techniques for fabricating precise components at submicron levels. Along with the need for smaller components, there has been a growing demand for devices requiring less power consumption. In the manufacture of transistors, these trends have led the industry to refine approaches to achieve thinner gate oxides.

Currently, thin gate oxides are grown by essentially two methods. In the first method, thermal oxidation in dry or wet $O_2$ ambients is used at elevated temperatures in a furnace to grow a silicon dioxide layer superjacent a silicon substrate. The second method for growing a thin gate oxide involves Rapid Thermal Oxidation ("RTO") in a rapid thermal processor at high temperatures over a short period of time.

Under both processes, however, native silicon dioxide (hereinafter "native oxide") develops directly on the surface or interface of the substrate. Native oxide, having different characteristics than grown silicon dioxide, has a substantial impact on the overall electrical and structural characteristics of the gate oxide. Thus, the integrity of the overall gate oxide is limited under the current methods.

Furthermore, the current methods have substantial limitations. With respect to the furnace approach, gate oxides with a thickness in the 80Å to 120Å range are not as reliable. Moreover, RTO oxides require a high thermal budget and are further confined by throughput criteria which are not viable in a manufacturing environment.

SUMMARY OF THE INVENTION

The primary object of the present invention is to eliminate the aforementioned manufacturing problems.

Another object of the present invention is to provide a method of fabricating a high integrity silicon dioxide layer for thin gate devices.

A further object of the present invention is to provide a method of fabricating a thin gate device having improved gate oxide integrity which is free from any hot carrier effects, thereby improving overall reliability.

Yet another object of the present invention is to provide a method of fabricating a thin gate device which provides manufacturing versatility and flexibility.

In order to achieve the hereinabove objects, as well as others which will become apparent hereafter, a method and system for fabricating semiconductor wafers is disclosed wherein a rugged and/or smooth, atomically clean, silicon or polysilicon substrate having a surface is provided in a rapid thermal processing ("RTP") chamber. One embodiment involves cleaning the substrate by exposing it to at least one of $NF_3$, $GeH_4$, HF, and $H_2$ diluted with $Ar-H_2$ at a temperature substantially within the range of 850° C. to 1250° C. for approximately 10 to 60 seconds. Subsequently, a coating having a first thickness is formed superjacent the substrate surface by introducing at least one of $O_2$, $N_2O$, and $NF_3$ at a temperature substantially within the range of 850° C. to 1250° C. for approximately 5 to 30 seconds in the chamber. The resultant coating, depending on the gas selected, is either $SiO_2$ or Si-F. The thickness of the coating is in the approximate range of 10Å to 40Å.

Subsequently, the substrate having the coating is exposed to at least one of $O_2$ and $N_2O$ at a temperature substantially within the range of 900° C. to 1050° C. for approximately 30 minutes to one hour, thereby resulting in a silicon dioxide layer. The silicon dioxide layer has a thickness in the approximate range of 50Å to 150Å, and is disposed superjacent the substrate and subjacent the coating. The silicon dioxide layer diffuses through the above mentioned coating because of the chemical properties of the elements involved.

In one embodiment of the invention, the step of forming a silicon dioxide layer is performed in a furnace. In an alternate embodiment of the present invention, a transferring device, such as a robot, is employed, using a load lock, to transfer the substrate between the RTP chamber and the furnace without exposing the substrate to atmospheric pressure. The present invention can also be accomplished by varying the order of the steps involved.

BRIEF DESCRIPTION OF THE DRAWINGS

The present invention will be better understood from reading the following description of non-limitative embodiments, with reference to the attached drawings, wherein below.

DETAILED DESCRIPTION OF THE INVENTION

Figure 1:
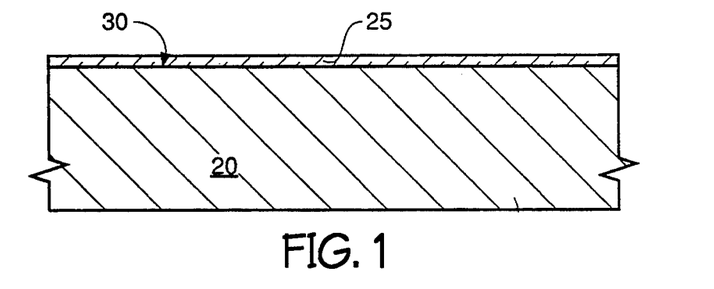
FIG. 1 is a cross-sectional view of a semiconductor substrate prior to undergoing the steps of the present invention.

Referring to FIG. 1, a semiconductor substrate 20 within an RTP chamber (not shown) is illustrated prior to undergoing process of the present invention. Substrate 20 can comprise single crystal silicon, polycrystalline silicon ("polysilicon"), or any other suitable substrate known in art. Further, the silicon or polysilicon can be rugged and/or smooth.

Superjacent substrate 20 is a layer of native oxide 25 which is formed on the surface interface 30. This is in part because of the substrate's 20 exposure to the atmosphere. Native oxide 25, having different characteristics than grown silicon dioxide, has a substantial impact on the overall electrical and structural characteristics of a gate oxide. Thus, the integrity of the overall gate oxide is limited by native oxide layer 25.

To provide better control of interface 30, and to improve the oxidation of the substrate for gate purposes, the native oxide 25 must be removed. Thus, the first step in the present invention involves atomically cleaning substrate 20, preferably in-situ, before growing any further layers.

There are a variety of techniques for removing native oxide 25. Those known to one of ordinary skill in the art are not described. In the preferred embodiment of the present invention, RTP is employed to remove native oxide 25 by introducing a reactive gas, such as $NF_3$, $GeH_4$, HF, or $H_2$ further diluted with an inert gas, such as $Ar-H_2$, and heat at a temperature substantially within the range of 850° C. to 1250° C. for approximately 10 to 60 seconds. Relying on this method, native oxide 25 having a thickness between 10Å and 20Å can be easily removed.

Figure 2:
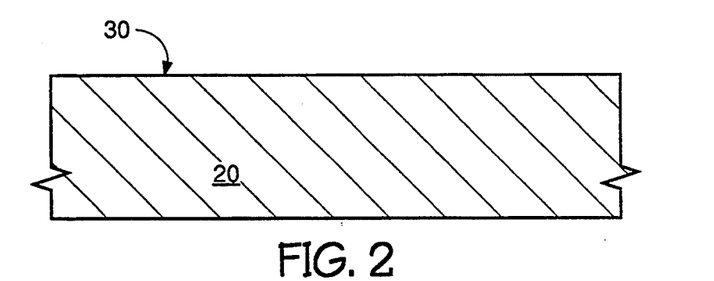
FIG. 2 is a cross-sectional view of a semiconductor substrate undergoing the first step of the present invention.

FIG. 2 illustrates substrate 20, after cleaning. In the preferred embodiment of the present invention, the RTO step is then performed in-situ. Alternatively, this step, as well as the remaining steps can be performed at atmospheric pressure.

RTO is an RTP approach for oxidizing a substrate. In principal, RTO is similar to annealing. As such, RTO is performed on an essentially clean substrate 20 to enable the growth of a high integrity thermal coating or layer 40 (hereinafter "high integrity layer").

Figure 3:
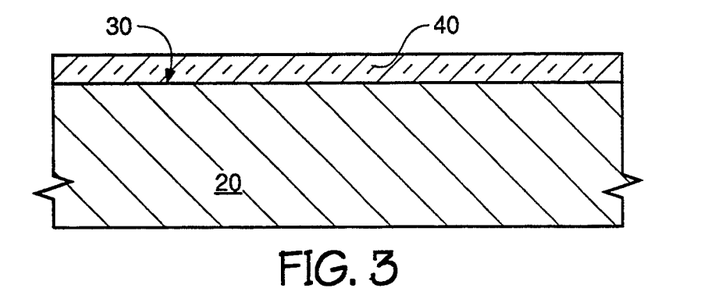
FIG. 3 is a cross-sectional view of the semiconductor substrate undergoing the second step of the present invention.

By performing RTO on an essentially clean substrate 20, high integrity layer 40 is formed superjacent interface 30, as shown in FIG. 3. In the preferred embodiment of the present invention, the RTO step is accomplished by exposing substrate 20 to an oxygen containing gas, such as $O_2$ and $N_2O$, at a temperature between 850° C. and 1250° C. for a period approximately between 5 seconds and 30 seconds, thereby forming a high integrity silicon dioxide layer 40. The chemical composition of layer 40 is dependent on the gas selected.

In an alternate embodiment of the present invention, substrate 20 is exposed to a fluorine containing gas, such as $NF_3$, at a temperature between 850° C. and 1250° C. for a period approximately between 5 seconds and 30 seconds during the RTO step. Under this approach, high integrity layer 40 comprises Si-F and $SiO_2$.

Upon completion of the RTO step, substrate 20 having high integrity layer 40 superjacent, is prepared for further oxidation. As a result of the RTO step, high integrity layer 40 is fabricated within a short period of time and has a thickness between 30Å and 50Å. As the growth of layer 40 peaks to a thickness between 30Å and 50Å, further oxidation is required to achieve a greater silicon dioxide thickness. In light of the characteristics of layer 40, and removal of native oxide 25, subsequent layers of silicon dioxide can be formed by means of a furnace without substantially impacting the attributes of the resultant silicon dioxide layer.

Figure 4:
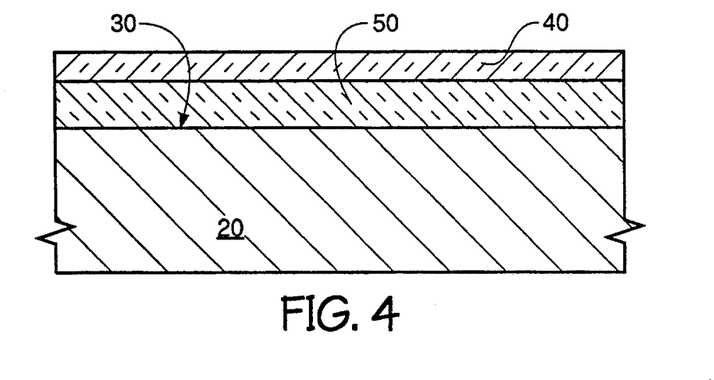
FIG. 4 is a cross-sectional view of the semiconductor substrate undergoing the third step of the present invention.

Referring to FIG. 4, substrate 20 is depicted having high integrity layer 40 and a silicon dioxide layer 50. After growing high integrity layer 40 in the RTO step, substrate 20 is exposed to a gas and a temperature to produce silicon dioxide layer 50. In the preferred embodiment of the present invention, a gas, such as $O_2$ or $N_2O$, is employed at temperature substantially within the range of 900° C. to 1050° C. for approximately 30 minutes to one hour. This step yields silicon dioxide layer 50 superjacent substrate 20 while subjacent high integrity layer 40. This configuration arises in light of the chemical characteristics of silicon and oxygen and the reactive attributes thereof. The scientific principles behind the particular molecular level formation of silicon dioxide layer 50 subjacent high integrity layer 40, i.e. diffusion, are known to one of ordinary skill in the art, and as such, are not provided.

In one embodiment of the present invention, the final step is performed within a furnace (not shown). However, the step is preferably accomplished in-situ, such as by means of a rapid thermal processor (not shown), to avoid any exposure to outside atmosphere and the development of any native oxide. Nonetheless, if a furnace is employed, substrate 20 should be transferred from the chamber. To circumvent the potential formation of native oxide by this transferring, a load lock is employed between both RTP chamber and furnace.

The transfer between chamber and furnace described above can be performed by means of an automated handler. By using a robot, the present invention enables the employment of automation as a means for reducing the contaminants, and the costs associated with semiconductor fabrication. Further, automation has other substantial benefits. For example, substrate 20, already cleaned, may be transferred to the furnace to form silicon dioxide layer 50 first. Subsequently, substrate 20 having silicon dioxide layer 50 can be transferred back to the chamber to form high integrity layer 30. It is known to one of ordinary skill in the art that the chamber can be comprised of a variety of different tools, such as a rapid thermal processor, and thus is defined broadly.

Figure 5:
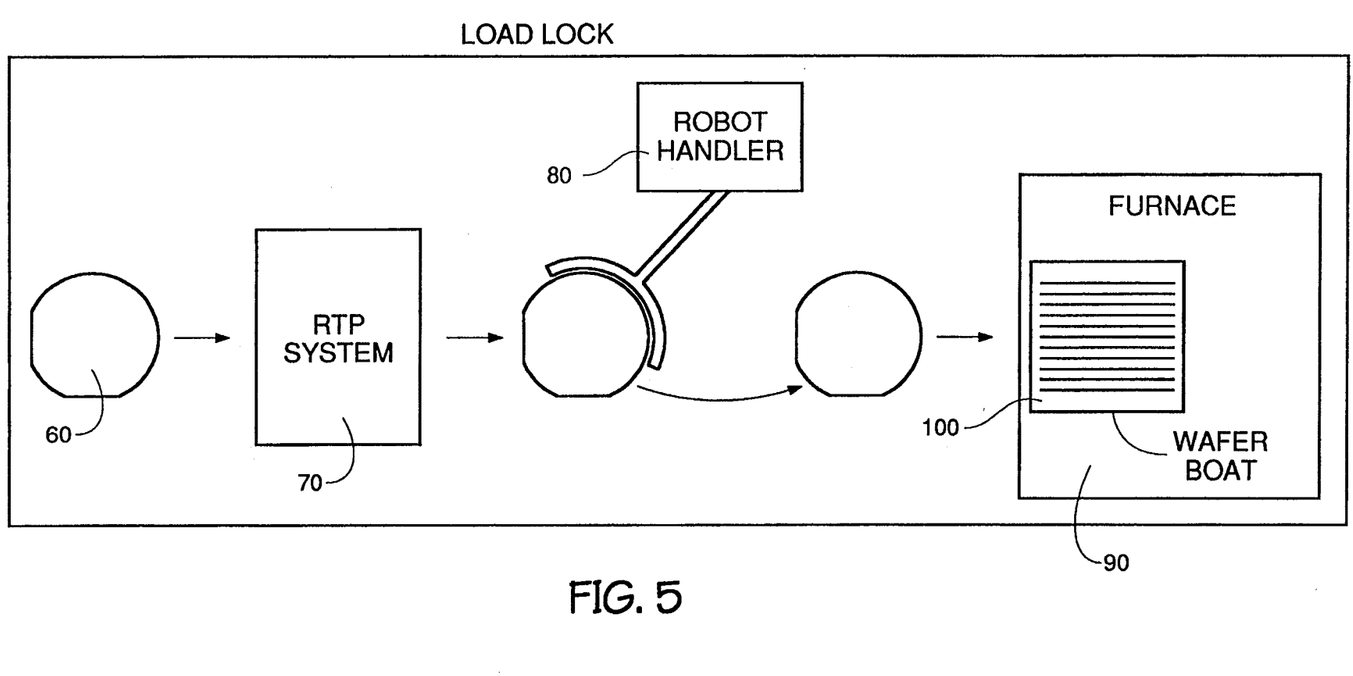
FIG. 5 is a system flow diagram of one embodiment of the present invention.

Given the advantages of automation, a system can be designed for performing the present inventive method. Referring to FIG. 5, a system is illustrated for accomplishing the present invention. Initially, a substrate 60 is inputted into the system by a feeding mechanism. A variety of feeding mechanism designs are devisable by one of ordinary skill in the art, and thus are not provided. Substrate 60, once inputted, is cleaned in an RTP chamber system 70. Substrate 60, now cleaned, can either be taken to the furnace 90 to form a silicon dioxide layer or remain within RTP chamber 70 to grow a high integrity layer. The transportation of the substrate is preferably accomplished by a automated handler 80. Automated handler 80, through a switching system (not shown), transfers substrate 60 between RTP chamber 70 and furnace 90 according to a predetermined order.

It is important to recognize that only one substrate 60 can be processed by the RTP chamber 70 at a time. However, many substrates 60 can be processed simultaneously by furnace 90. Given this reality, several substrates 60 could be placed within a boat 100 within furnace 90 to provide for concurrent processing. Thus, by employing an automated system, the total processing time, as well as the cost is substantially reduced, all while substantially reducing the exposure of the substrate 60 to contaminants.

Figure 6:
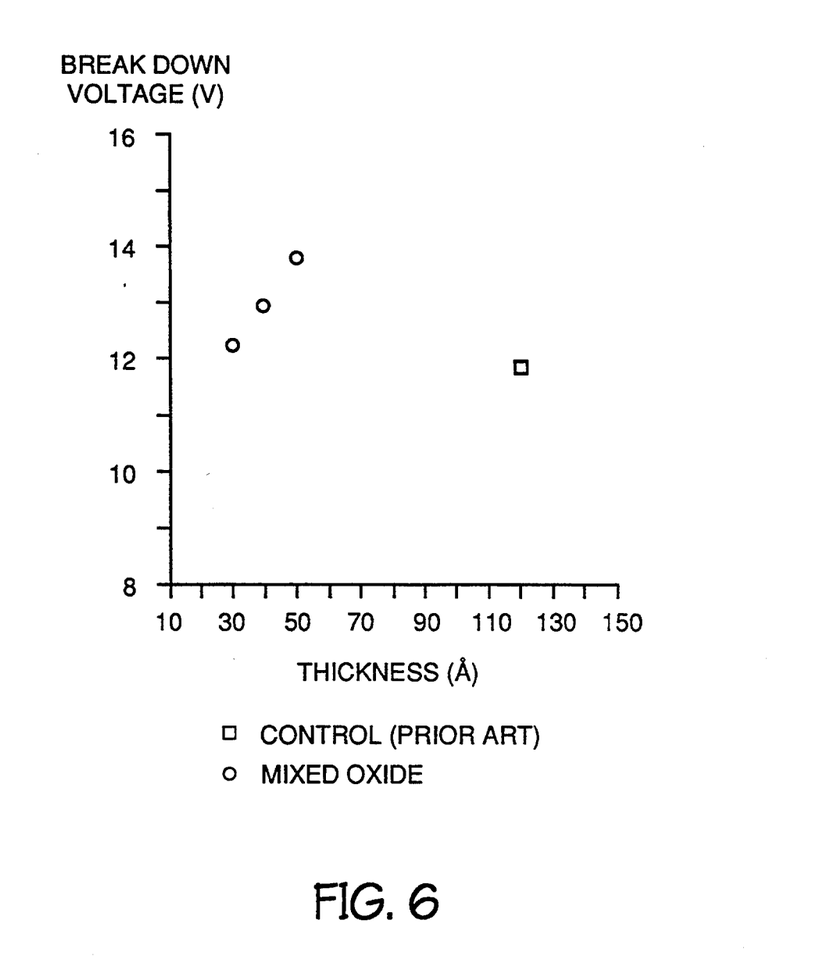
FIG. 6 is a graph comparing the Breakdown Voltage versus Oxide Thickness characteristics of the related art and the proposed invention.

Referring to FIG. 6, a graph comparing the Breakdown Voltage (V) versus Oxide Thickness (Å) characteristics of the related art and the proposed invention is illustrated. From the graph, it should be apparent, to one of ordinary skill in the art, that the mixed oxide approach of the present invention provides a substantial improvement over the related art.

Figure 7:
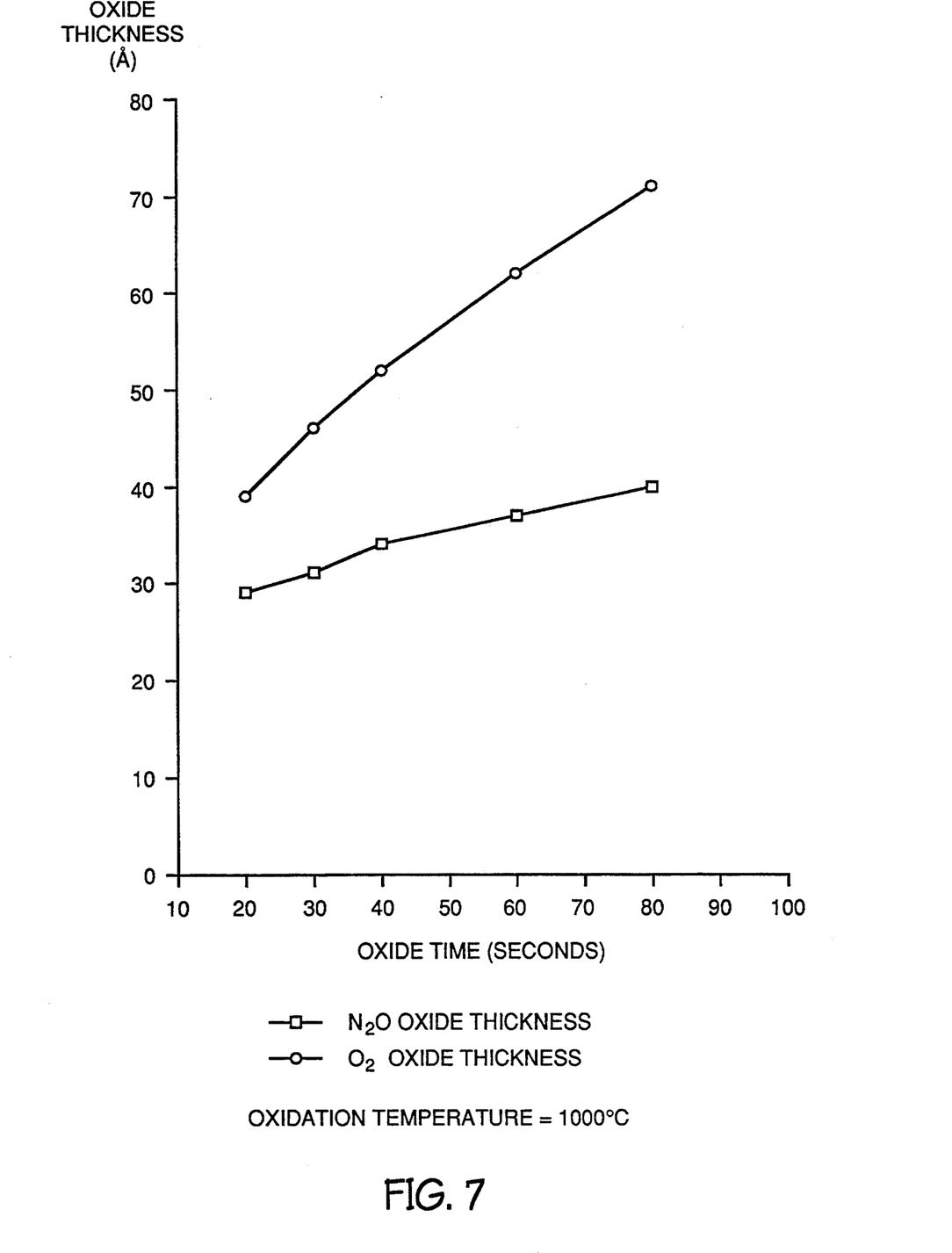
FIG. 7 is a graph comparing the Oxide Thickness versus Oxide Time characteristics of two embodiments of the proposed invention.

Referring to FIG. 7, a graph comparing the Oxide Thickness (Å) versus Oxide Time (Seconds) characteristics of $O_2$ and $N_2O$ in the RTO step of the present inventive method at a temperature of 1000° C. is shown. This graph emphasizes the slower oxidation rate of $N_2O$ compared to $O_2$.

Figure 8:
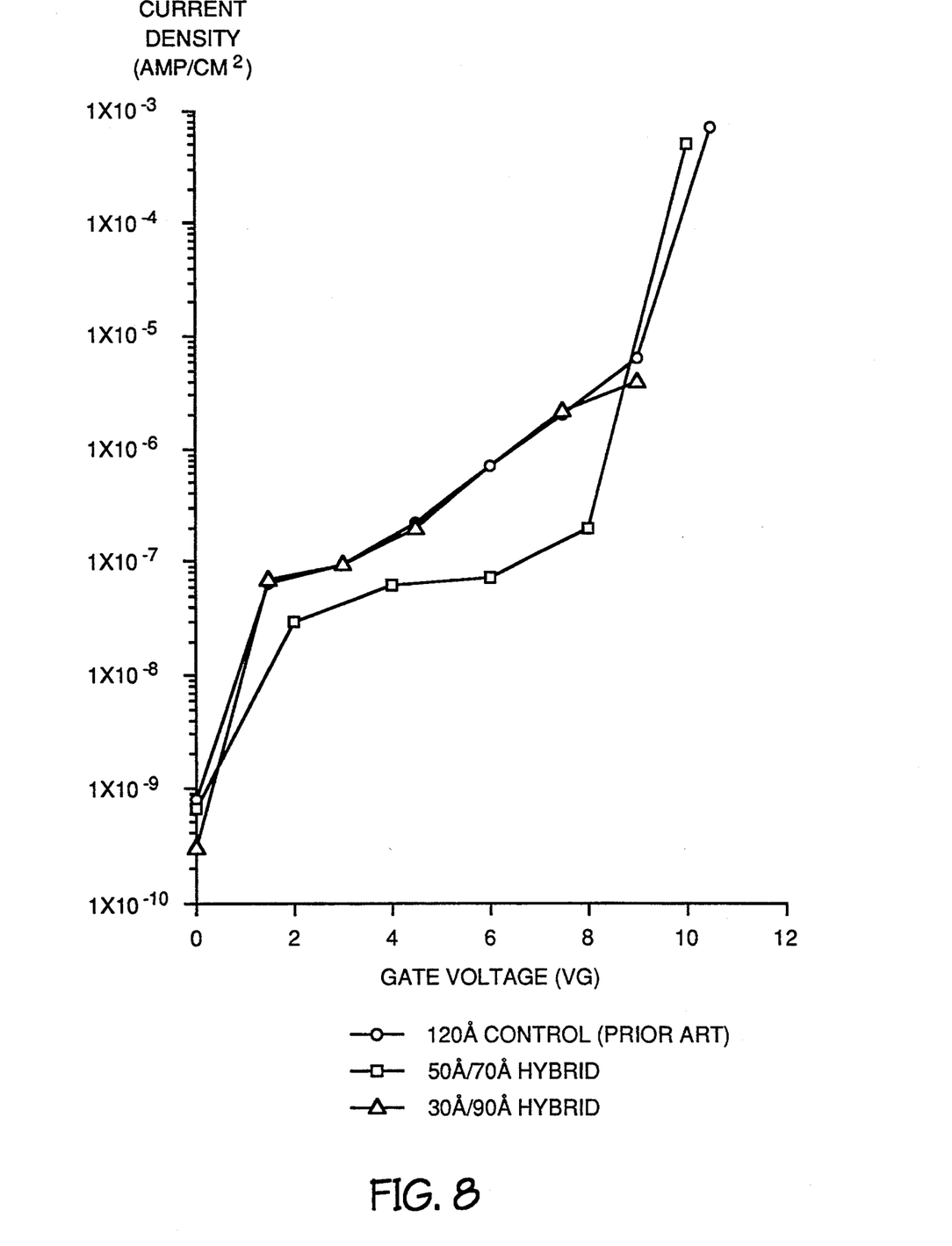
FIG. 8 is a graph comparing the Current Density versus Gate Voltage characteristics of the related art and two embodiments of the proposed invention.

Referring to FIG. 8, a graph comparing the Current Density (Amp/cm$^2$) versus Gate Voltage (V) characteristics of the related art and two different embodiments of the proposed invention are depicted. In the preferred embodiment, a combination silicon dioxide layer is grown, of which 50Å is grown by means of RTO, and 70Å is grown through a furnace. In an alternate embodiment, a combination silicon dioxide layer is of 30Å is grown by means of RTO, and 90Å is grown through a furnace. From the graph, it should be apparent to one of ordinary skill in the art that the preferred embodiment of the present invention provides a substantial improvement over the related art.

Figure 9:
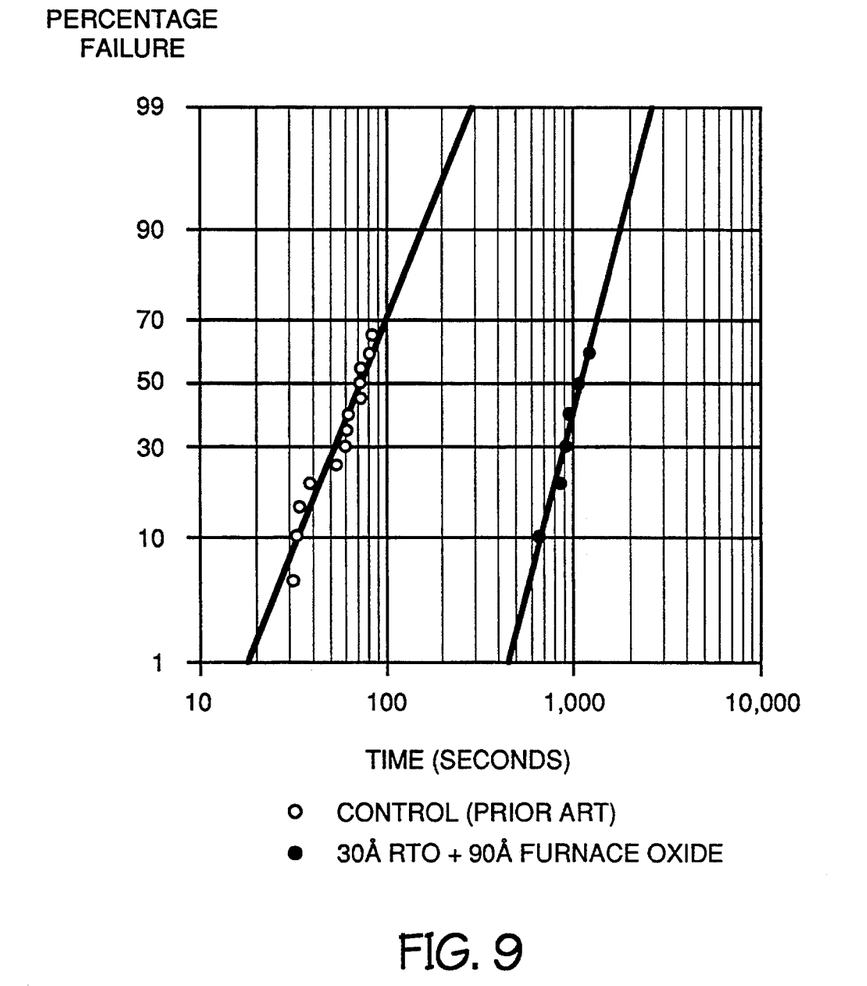
FIG. 9 is a graph comparing the Percentage Failure versus Time characteristics of the related art and the proposed invention.

Referring to FIG. 9, a graph comparing the Failure Percentage versus Time (Seconds) characteristics of the related art and the alternate embodiment of the proposed invention referred to in FIG. 8. From the graph, it should be apparent, to one of ordinary skill in the art, that the mixed oxide approach of the present invention provides a substantial improvement over the related art.

While the particular process as herein shown and disclosed in detail is fully capable of obtaining its objects and advantages herein before stated, it is to be understood that it is merely illustrative of the presently preferred embodiments of the invention and that no limitations are intended to the details herein shown, other than as described in the appended claims. Further, it is to be understood that although the present invention has been described in a preferred embodiment, various modifications known to those skilled in the art may be made without departing from the spirit of the invention, as recited in the claims appended hereto.

What is claimed is:

1. A method for fabricating a semiconductor wafers comprising the steps of:
    a) providing a substantially clean substrate in an RTP (Rapid Thermal Processing) chamber, said substrate having a surface, wherein said substrate is cleaned with at least one of $NF_3$, $GeH_4$, and $H_2$ diluted with Ar-$H_2$;
    b) forming a coating having a first thickness superjacent said surface by introducing a first gas and radiant energy in said RTP chamber; and
    c) forming a silicon dioxide layer having a second thickness superjacent said surface by introducing a second gas and energy.

2. A method for fabricating a semiconductor wafer, according to claim 1, wherein said silicon dioxide layer is disposed between said surface and said coating.

3. A method for fabricating a semiconductor wafer, according to claim 1, wherein step c) is performed in a furnace.

4. A method for fabricating a semiconductor wafer, according to claim 3, further comprising the step of:
    transferring said substrate between said chamber and said furnace, in-situ, thereby employing a load lock, between said forming a coating and said forming a silicon dioxide layer.

5. A method for fabricating a semiconductor wafer, according to claim 4, wherein said transferring is performed by an automated means.

6. A method for fabricating a semiconductor wafer, according to claim 5, wherein said automated means comprises a robotic handler.

7. A method for fabricating a semiconductor wafer, according to claim 1, wherein said energy of step b) generates a temperature substantially within the range of 850° C. to 1250° C. and is applied for approximately 5 to 30 seconds.

8. A method for fabricating a semiconductor wafer, comprising the steps of:
    providing a substantially clean substrate in a chamber, said substrate having a surface;
    forming a coating having a first thickness superjacent said surface by introducing a first gas and energy, said first gas comprising $NF_3$; and
    forming a silicon dioxide layer having a second thickness superjacent said surface by introducing a second gas and energy.

9. A method for fabricating a semiconductor wafer, according to claim 8, wherein said first gas further comprises at least one of $O_2$ and $N_2O$.

10. A method for fabricating a semiconductor wafer, according to claim 9, wherein said coating comprises silicon dioxide and SiF.

11. A method for fabricating a semiconductor wafer, according to claim 8, wherein said coating comprises Si-F.

12. A method for fabricating a semiconductor wafer, according to claim 10, wherein said method is performed at atmospheric pressure.

13. A method for fabricating a semiconductor wafer, according to claim 10, wherein said clean substrate is cleaned by exposing said substrate to a third gas at a temperature substantially within the range of 850° C. to 1250° C. for approximately 10 to 60 seconds.

14. A method for fabricating a semiconductor wafer, according to claim 13, wherein said third gas comprises at least one of $NF_3$, $GeH_4$, HF, and $H_2$ diluted with Ar-$H_2$.

15. A method for fabricating a semiconductor wafer, according to claim 10, wherein said first thickness is in the approximate range of 10Å to 40Å.

16. A method for fabricating a semiconductor wafer, according to claim 15, wherein said second thickness is in the approximate range of 50Å to 150Å.

17. A method for fabricating a semiconductor wafer, according to claim 10, wherein said energy of step c) generates a temperature substantially within the range of 900° C. to 1050° C. and is applied for approximately 30 minutes to one hour.

18. A method for fabricating a semiconductor wafer, according to claim 10, wherein said second gas comprises at least one of $O_2$ and $N_2O$.

19. A method for fabricating a semiconductor wafer, according to claim 10, wherein said chamber comprises a rapid thermal processor.

20. A method for fabricating a semiconductor wafer, comprising the steps of:
    a) providing a substantially clean substrate in a chamber, said substrate having a surface, said substrate being cleaned with at least one of $NF_3$, $GeH_4$, and $H_2$ diluted with Ar-$H_2$;
    b) transferring said substrate from said chamber to a furnace in-situ employing a load lock;

c) forming a silicon dioxide layer having a first thickness superjacent said surface by introducing at least one of $O_2$ and $N_2O$ into said furnace at a range of 900° C. to 1050° C. for approximately 30 minutes to one hour;
d) transferring said substrate from said furnace to said chamber in-situ employing a load lock; and
e) forming a film having a second thickness superjacent said surface by introducing at least one of $O_2$, $N_2O$ and $NF_3$ into said chamber at a range of 850° C. to 1250° C. for approximately 5 to 30 seconds, wherein said film is formed before said silicon dioxide layer.

* * * * *